United States Patent
Wang et al.

(10) Patent No.: US 9,076,856 B2
(45) Date of Patent: Jul. 7, 2015

(54) POSITIONING SYSTEM

(75) Inventors: Yan-Yi Wang, New Taipei (TW); Chia-Hao Wu, Taipei (TW); Ming-Kun Weng, New Taipei (TW); Chung-Yu Chou, New Taipei (TW)

(73) Assignees: LITE-ON ELECTRONICS (GUANGZHOU) LIMITED, Guangzhou (CN); LITE-ON TECHNOLOGY CORPORATION, Taipei (TW)

( * ) Notice: Subject to any disclaimer, the term of this patent is extended or adjusted under 35 U.S.C. 154(b) by 481 days.

(21) Appl. No.: 13/490,422

(22) Filed: Jun. 6, 2012

(65) Prior Publication Data

US 2013/0201465 A1    Aug. 8, 2013

(30) Foreign Application Priority Data

Feb. 6, 2012    (CN) .......................... 2012 1 0024676

(51) Int. Cl.
  *G03B 27/58*    (2006.01)
  *H01L 23/00*    (2006.01)

(52) U.S. Cl.
  CPC .................. *H01L 24/78* (2013.01); *H01L 24/97* (2013.01); *H01L 2224/78701* (2013.01); *H01L 24/48* (2013.01); *H01L 24/85* (2013.01); *H01L 2224/48* (2013.01); *H01L 2924/00014* (2013.01); *H01L 2224/7898* (2013.01); *H01L 2924/12041* (2013.01)

(58) Field of Classification Search
  CPC ........................... G03F 7/7071; A01B 12/006
  USPC .................... 355/72–76; 378/34, 35; 361/234
  See application file for complete search history.

(56) References Cited

U.S. PATENT DOCUMENTS

| | | | |
|---|---|---|---|
| 6,211,945 B1 * | 4/2001 | Baxter et al. ..................... | 355/53 |
| 6,265,324 B1 * | 7/2001 | Tsutsui et al. ................ | 438/758 |
| 7,396,558 B2 * | 7/2008 | Fujimori et al. ................ | 427/66 |
| 2004/0020435 A1 * | 2/2004 | Tsuchiya et al. ........ | 118/723 VE |

* cited by examiner

*Primary Examiner* — Hung Henry Nguyen
(74) *Attorney, Agent, or Firm* — Li & Cai Intellectual Property (USA) Office

(57) ABSTRACT

A positioning system includes a first working platform, a second working platform spaced apart from the first working platform, and a carrier. The carrier is fixed on the first working platform or the second working platform. The carrier has at least one fixing member for fixing the substrate onto the carrier and fixing the mask onto the substrate. The substrate has at least one fixing hole formed thereon for receiving the fixing member, and the mask has at least one positioning hole formed thereon in alignment with the fixing hole. The fixing member is capable of inserting sequentially through the fixing hole of the substrate and the positioning hole of the mask.

10 Claims, 15 Drawing Sheets

POSITIONING SYSTEM

BACKGROUND OF THE INVENTION

1. Field of the Invention

The present invention relates to a positioning system; more particularly, to a positioning system capable of accurately arranging a mask on a substrate.

2. Description of Related Art

During the packaging process of the light-emitting diodes (LEDs), luminescent solution having phosphor powder is typically glued or coated onto an LED chip. For some coating processes, the LED chip is electrically connected to an LED substrate via a wire bonding process. Conventionally, a mask is manually arranged on the LED substrate that supports the LED chip. However, the wires may be touched by the mask during the manual procedure. As a result, the reliability of the LED packaging process tends to suffer. In addition, some small gap or clearances are usually present between the mask and the LED substrate. In other words, the mask and the LED substrate is not seamlessly arranged against one another. Hence, during the coating process, the luminescent solution can very easily leak to areas where coating and wire bonding processes are yet completed. Accordingly, the yield rate of the wire bonding process is reduced, as the wires of the light-emitting diodes tend to break easily during reliability tests, such as thermal shock or thermal cycle tests.

SUMMARY OF THE INVENTION

The prevent invention provides a positioning system, which can accurately arrange a mask on a substrate.

The positioning system of the present invention allows the mask to be arranged accurately on the substrate through the fixing members in a non-manual manner. Thus, the yield rate of the wire bonding process for the LED chips can be increased.

For further understanding of the present invention, reference is made to the following detailed description illustrating the embodiments and examples of the present invention. The description is for illustrative purpose only and is not intended to limit the scope of the claim.

DETAILED DESCRIPTION OF THE EMBODIMENTS

First Embodiment

FIGS. 1A-1J are respectively schematic views of operating a positioning system for a first embodiment of the present invention. However, the procedures and the number of components described hereinbelow are for illustrative purpose only and are not intended to limit the scope of the present invention.

Figure 1A:
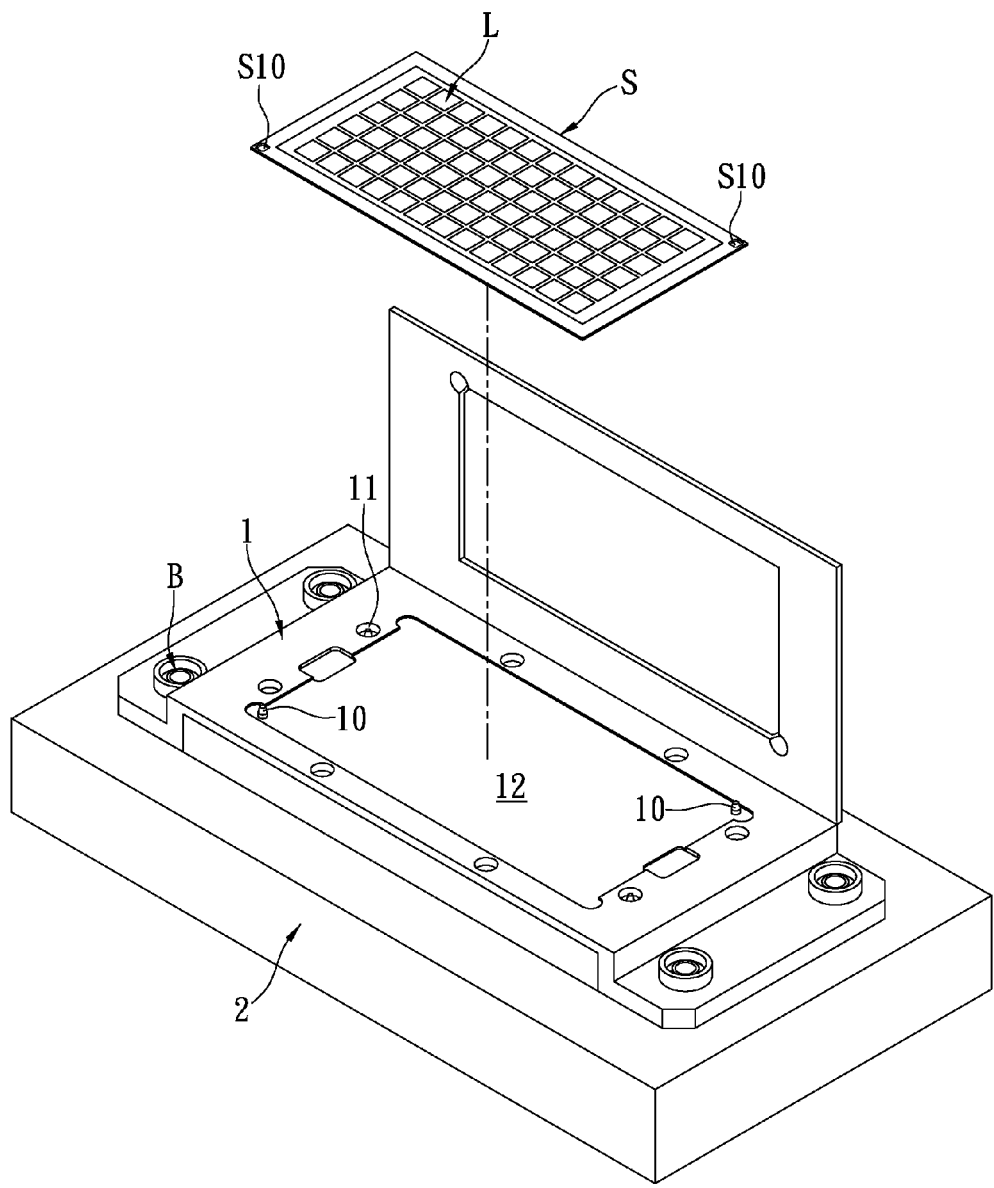
FIGS. 1A-1J show process flow diagrams illustrating operating a positioning system for a first embodiment of the present invention.
Figure 1B:
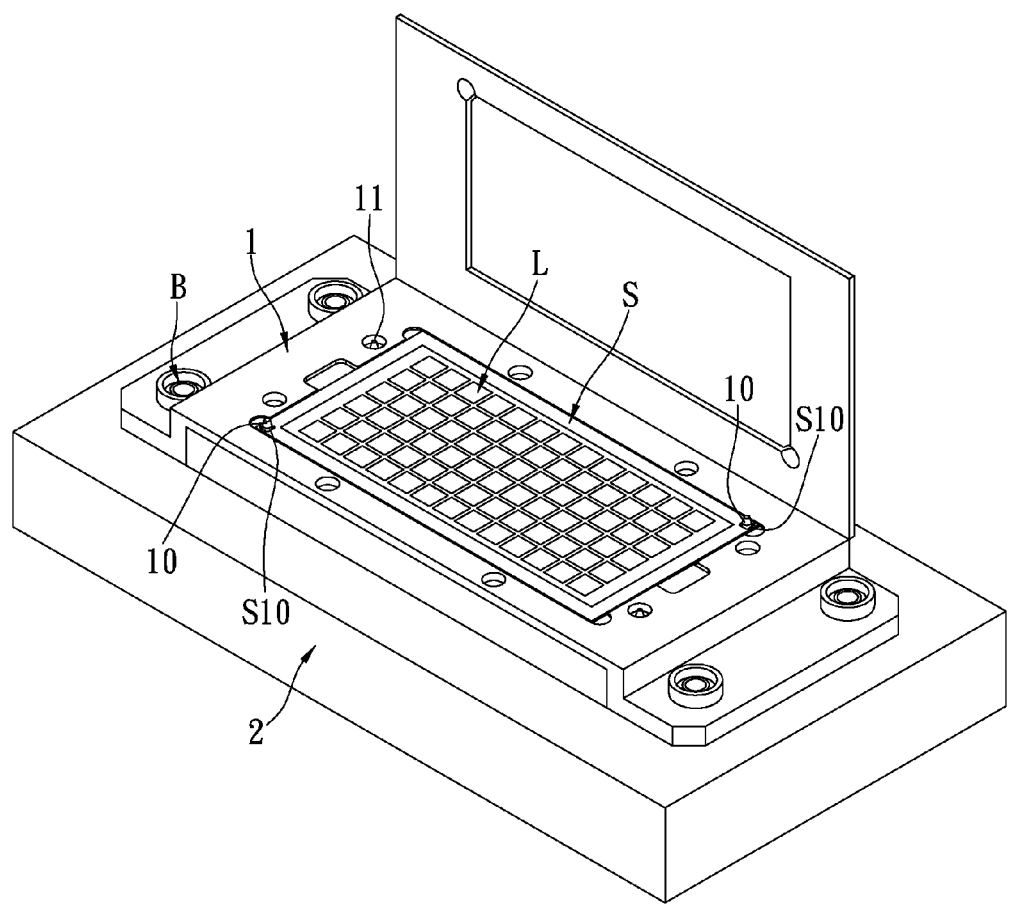

Please refer to FIGS. 1A and 1B. A carrier 1 is fixed to a first working platform 2 (as shown in FIG. 1A). Then, a substrate S for supporting a plurality of light-emitting units L is fixed to the carrier 1 (as shown in FIG. 1B).

For example, the carrier 1 may be fixed to the first working platform 2 through a plurality of protrusions B (e.g., bushings). Furthermore, at least a pair of fixing members 10 is arranged diagonally to one another on the carrier 1. The substrate S has at least a pair of fixing holes S10 formed diagonally to one another thereon for receiving the fixing members 10. In addition, the carrier 1 has a recess 12 formed thereon for accommodating the substrate S. The fixing members 10 are inserted through the fixing holes S10. The combined utilization of the recess 12 and the fixing members 10 allow the substrate S to align and fix accurately to the carrier 1.

Figure 1C:
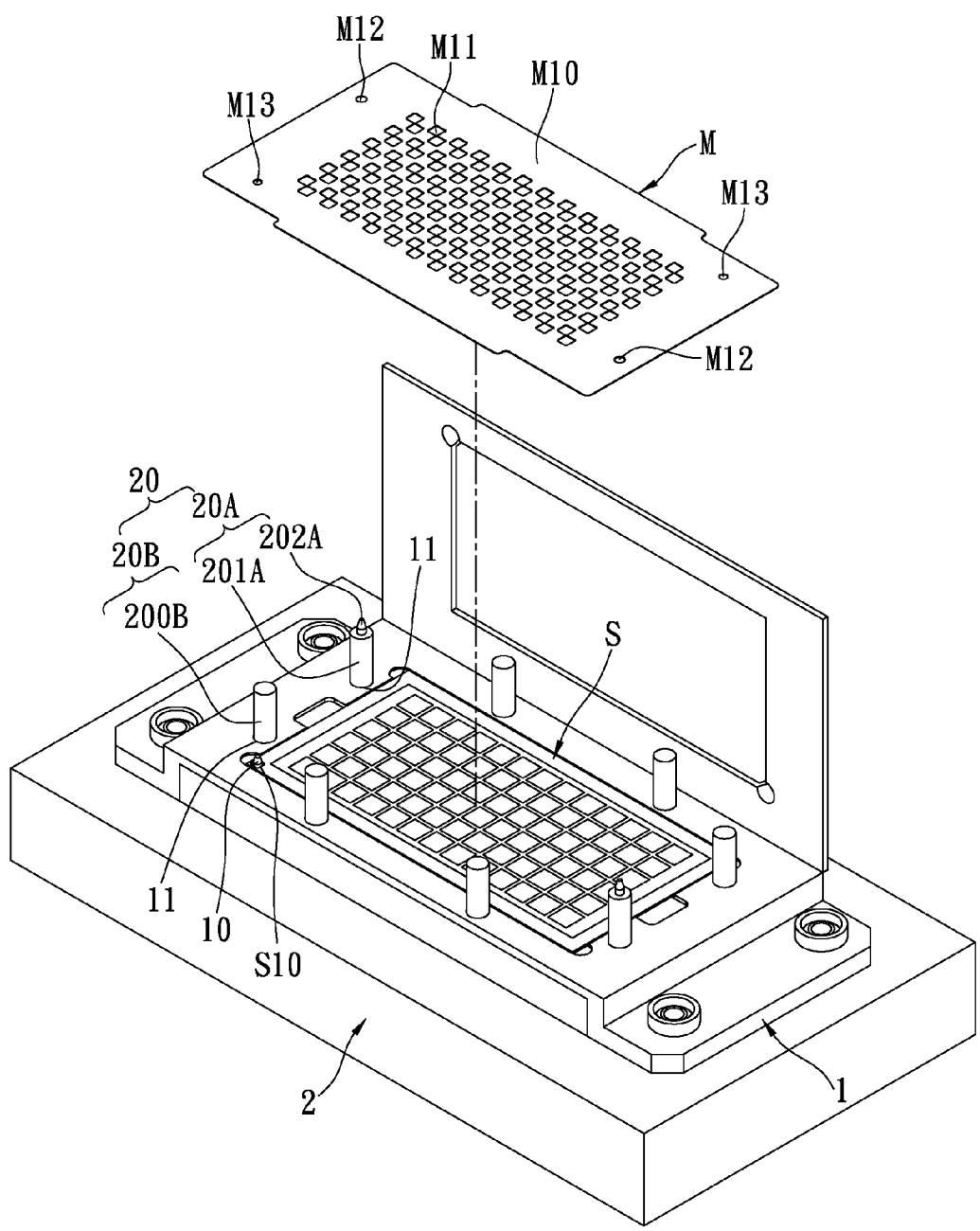
Figure 1D:
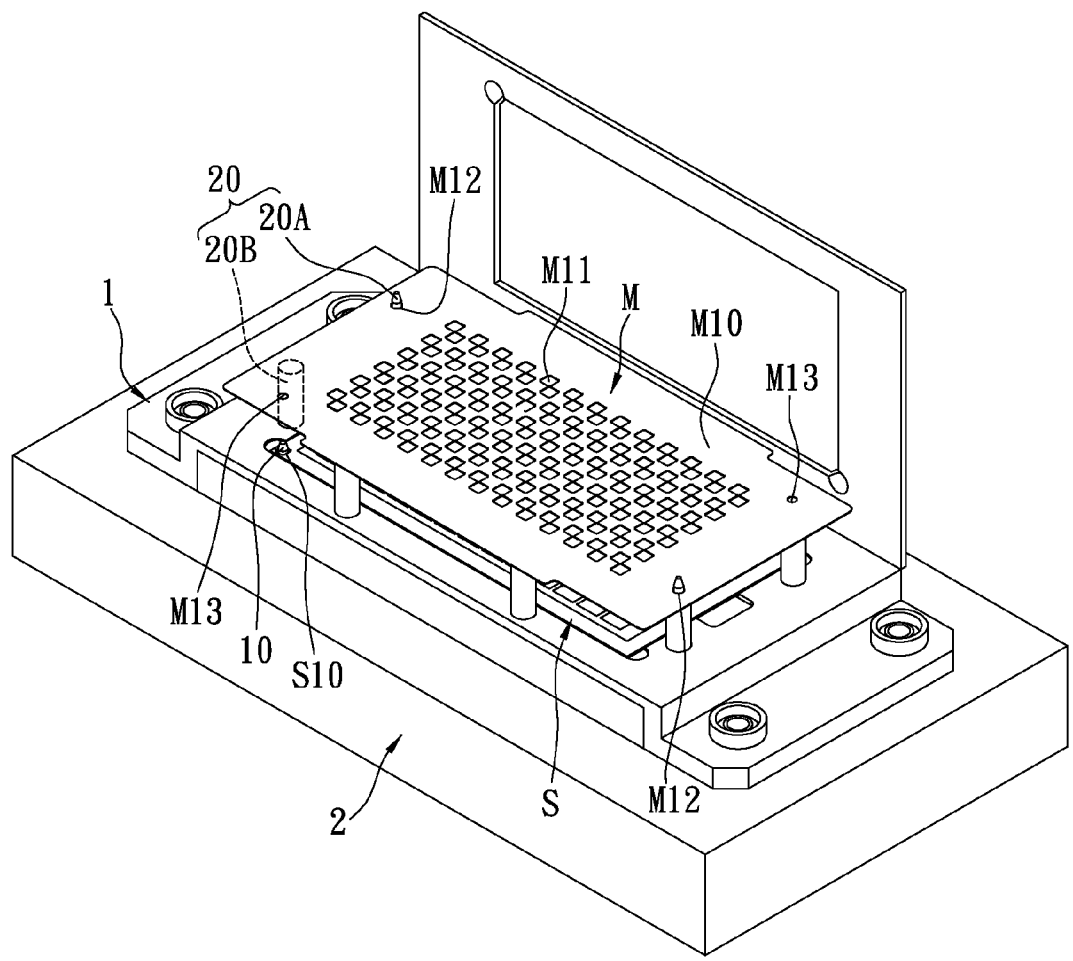

Next, please refer to FIGS. 1C and 1D. The first working platform 2 includes at least one protrudable/retractable catch mechanism 20. The catch mechanism 20 includes at least a pair of positioning members 20A and a plurality of support members 20B. The positioning members 20A are spaced diagonally from one another, and the support members 20B are arranged at the periphery of the substrate S and surround the recess 12. Through a plurality of storage holes 11 formed on the carrier 1, the positioning members 20A and the support members 20B are selectively protruded/retracted from/into the first working platform 2. In this embodiment, the positioning members 20A and the support members 20B are cylindrical or columnar structure, but the present invention is not limited thereto. When in use, the positioning members 20A and the support members 20B can be protruded from the first working platform 2, where respective tip portions of each positioning member 20A and support member 20B are arranged concurrently above the substrate S for aligning a mask M. For such condition, the positioning members 20A and the support members 20B are defined to be at a first position. In other words, after the substrate S is arranged on the carrier 1 (as shown in FIG. 1B), the positioning members 20A and the support members 20B of the catch mechanism 20 are elevated concurrently from the first working platform 2 through the storage holes 11 (as shown in FIG. 1C). Then, the matching mask M of the substrate S is arranged on the catch mechanism 20 (as shown in FIG. 1D).

The mask M can be made of a magnetic material, such as iron, cobalt, nickel, alloys having these materials, ferric oxide and so on, that has a high carbon content and does not rust easily. The mask M has a covering body M10, a plurality of slits M11 formed on the covering body M10, at least a pair of first positioning holes M12 formed through the covering body M10 for receiving the positioning members 20A, and at least a pair of second positioning holes M13 formed through the covering body M10 for receiving the fixing members 10. Each of the positioning members 20A has a main body 201A and a positioning head 202A. The main body 201A can be protruded from the first working platform 2 and the carrier 1 and abutted to an undersurface of the covering body M10, and the positioning head 202A can be inserted through the corresponding first positioning hole M12. The positioning head 202A is formed on one end of the main body 201A. Similarly, each of the support members 20B has a support body 200B capable of being protruded from the first working platform 2 and the carrier 1 and being abutted to the undersurface of the mask M.

The tip portion of each positioning member 20A is defined to include an end portion of the main body 201A and the entire positioning head 202A. Whereas the tip portion of each support member 20B is defined to be an end portion of the support body 200B abutting to the mask M. In other words, not only is the mask M evenly supported by the tip portions of the positioning members 20A and the support members 20B, but the positioning heads 202A and the first positioning holes M12 function cooperatively to securely align the mask M. By being supported by the support members 20B, even if the mask M is very thinly constructed, the mask M can be supported evenly by the support members 20B in a non-warping manner. Meanwhile, the insertion of the positioning heads 202A of the positioning members 20A through the first positioning holes M12 allows the mask M to be accurately arranged on the catch mechanism 20.

Figure 1E:
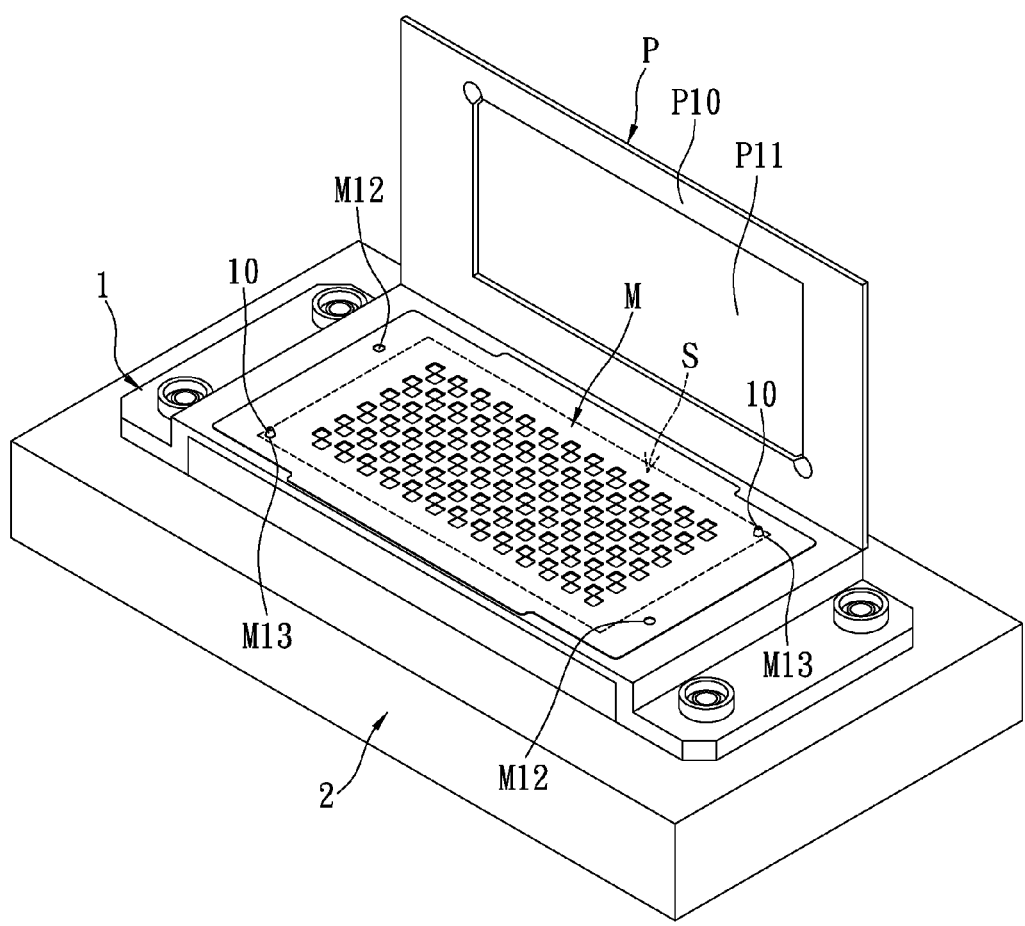

Please refer to FIGS. 1D and 1E. The tip portion of each positioning member 20A and the tip portion of each support member 20B may be concurrently arranged at a retracted position. The retracted position is defined to be a second position where the mask M is fixed to the substrate S through the fixing members 10. In other words, after the mask M is arranged securely on the catch mechanism 20 (as shown in FIG. 1D), the positioning members 20A and the support members 20B of the catch mechanism 20 are retracted concurrently into the first working platform 2 and are released from the mask M. Thus, as shown in FIG. 1E, the mask M is aligned and fixedly disposed on the substrate S through the second positioning holes M13 and the fixing members 10.

As mentioned before, the second positioning holes M13 are formed for receiving the fixing members 10 and in alignment with the fixing holes S10 (as shown in FIG. 1C or 1D). Thus, when the positioning members 20A and the support members 20B are retracted to disengage the mask M, the fixing members 10 are inserted through the second positioning holes M13, allowing the mask M to be aligned and fixedly disposed on the substrate S. Based on the aligning characteristic between the second positioning holes M13 and the fixing members 10, at the moment when the positioning members 20A and the support members 20B disengage from the mask M, the second positioning holes M13 are self-engaged and retained by the fixing members 10. Thus, when the mask M is aligned and fixedly disposed on the substrate S, the mask M does not touch a blue LED chip L11 of the light-emitting units L and its wires W (as shown in FIG. 1H). Thus, the wires W can be kept from being damaged while raising the yield rate of the wire bonding process.

Figure 1F:
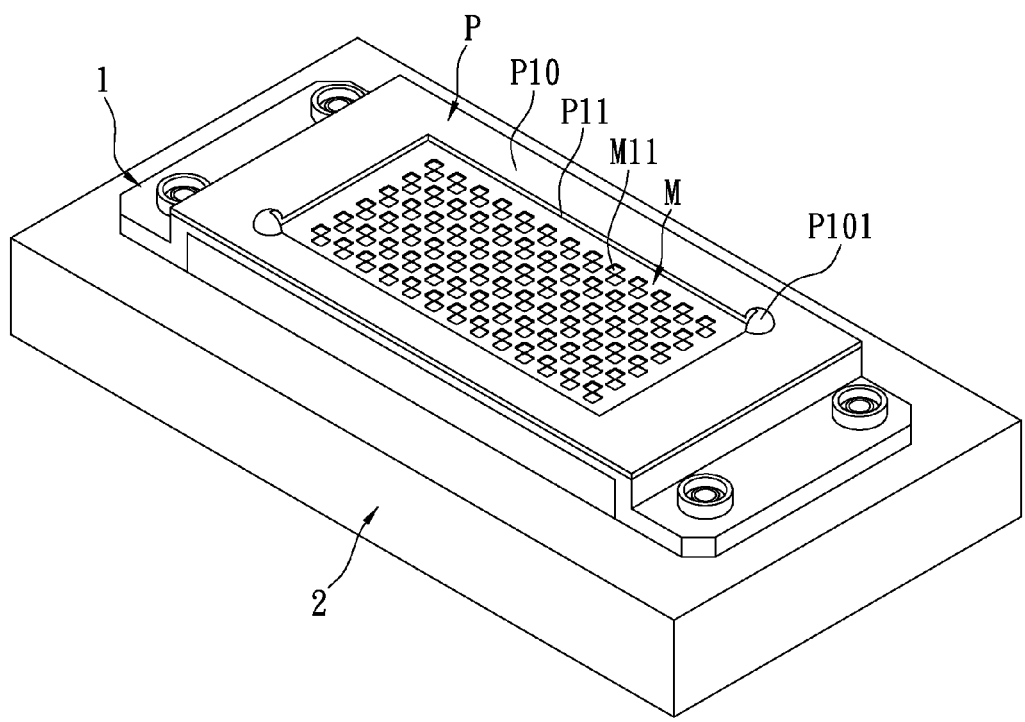

Please refer to FIGS. 1E and 1F. Once the mask M is aligned and fixedly disposed on the substrate S (as shown in FIG. 1E) through the fixing members 10, a press plate P is movably disposed on the carrier 1 to hold down a peripheral portion of the mask M (as shown in FIG. 1F). In this embodiment, the press plate P is pivotally connected to one side of the carrier 1 for the ease of operation. The press plate P has a plate body P10 and a window-like opening P11 formed thereon. When the press plate P is disposed on the carrier 1, the plate body P10 is used to press down the peripheral portion of the mask M (i.e., a peripheral portion of the covering body M10). The slits M11 are exposed through the opening P11 of the press plate P. In addition, when the press plate P is disposed on the carrier 1, the fixing members 10 are retained in domeshaped structures P101 arranged diagonally to each other at the corners of the opening P11.

Figure 1G:
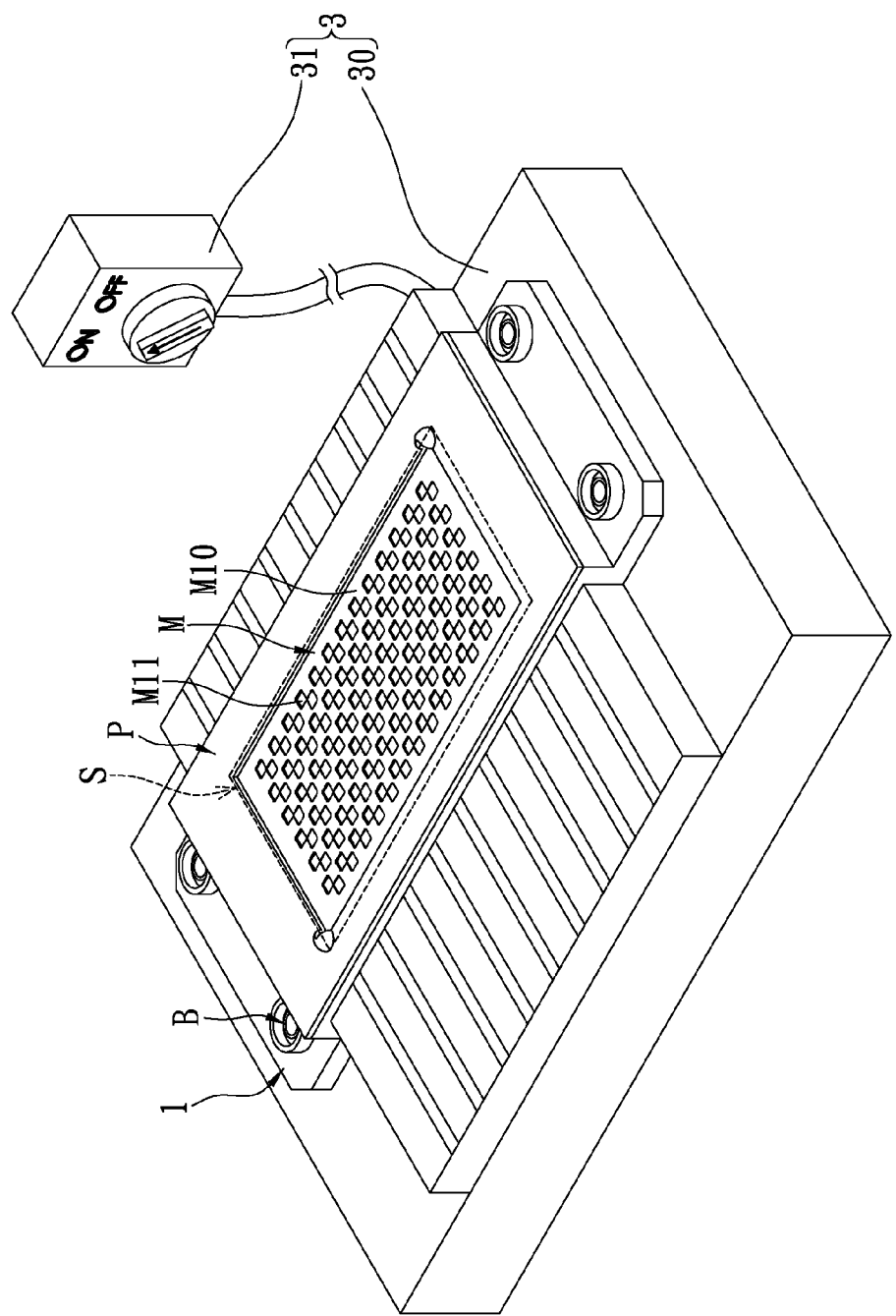
Figure 1H:
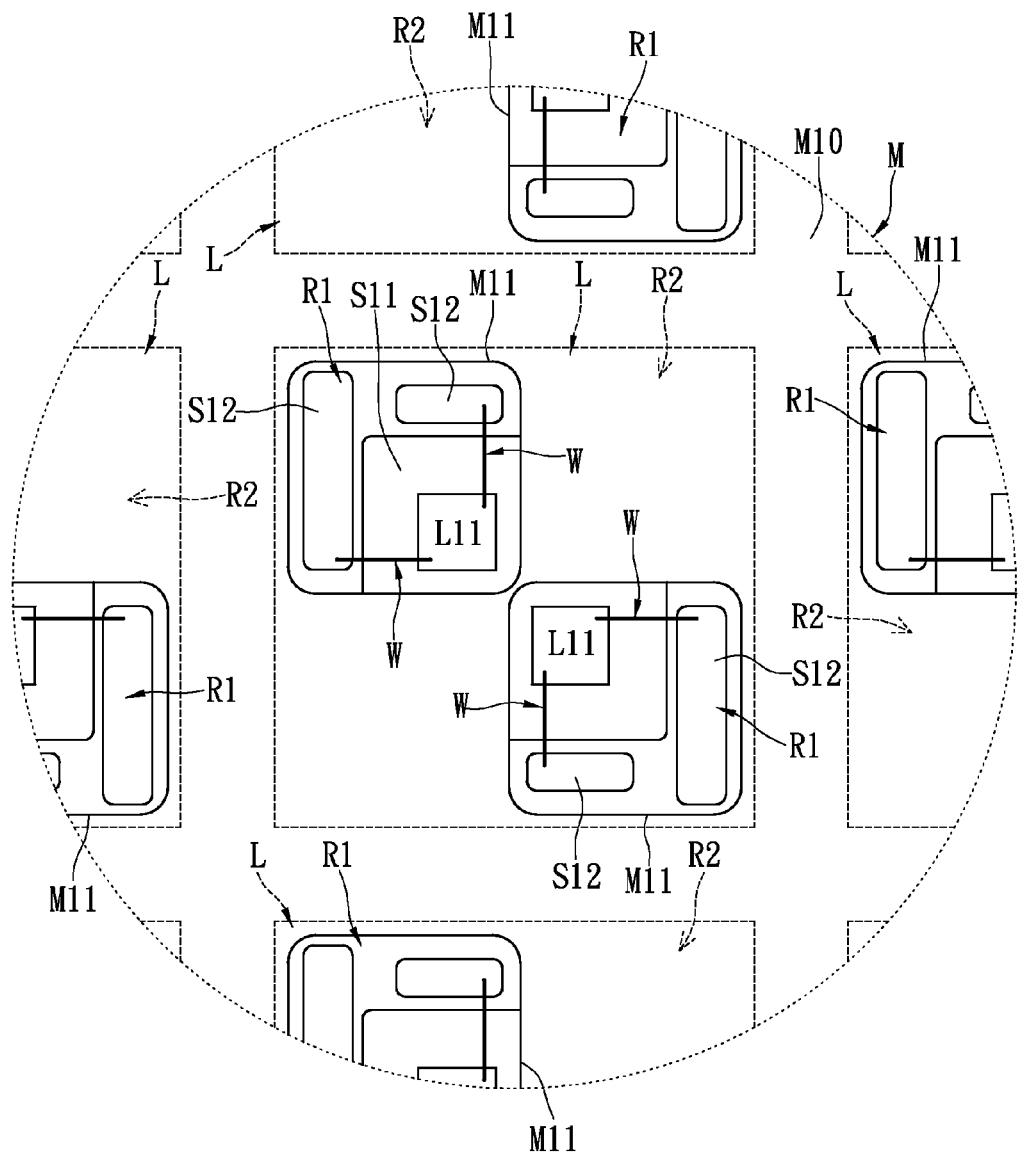

Next, please refer to FIGS. 1F and 1G. After the press plate P is disposed on the carrier 1 (as shown in FIG. 1F), the carrier 1 is removed from the first working platform 2 and disposed on a second working platform 3 (as shown in FIG. 1G). The second working platform 3 is separated from the first working platform 2 by a predetermined distance, i.e. the first and second working platforms 2 and 3 are spaced apart from each other. The protrusions B can be used again by the second working platform 3 to receive the carrier 1. The second working platform 3 comprises an electromagnetic force generating module 30 and a control module 31 for switching the electromagnetic force generating module 30 on or off. Thus, once the carrier 1 is fixedly disposed on the second working platform 3, the presence of the magnetic force provided by the electromagnetic force generating module 30 (i.e., the control module 31 is switched on, as shown in FIG. 1G) enables the mask M having magnetic attraction to be attracted tightly to the substrate S. In other words, the mask M can be tightly attracted to the substrate S through the magnetic force generated by the electromagnetic force generating module 30 such that small gap or clearances are less likely to occur between the mask M and the substrate S. Thus, luminescent solution leakage can be prevented during the coating process. Similarly, the press plate P made of magnetic materials is also attracted tightly to the mask M by the generated magnetic force. Hence, contamination of the second working platform 3 due to luminescent solution leakage through between the plate body P10 and the mask M can be avoided. Moreover, since the dome-shaped structures P101 are formed on the press plate P, the luminescent solution cannot be sprayed on the fixing members 10, the fixing holes S10, and the second positioning holes M13 during the coating process.

Figure 1I:
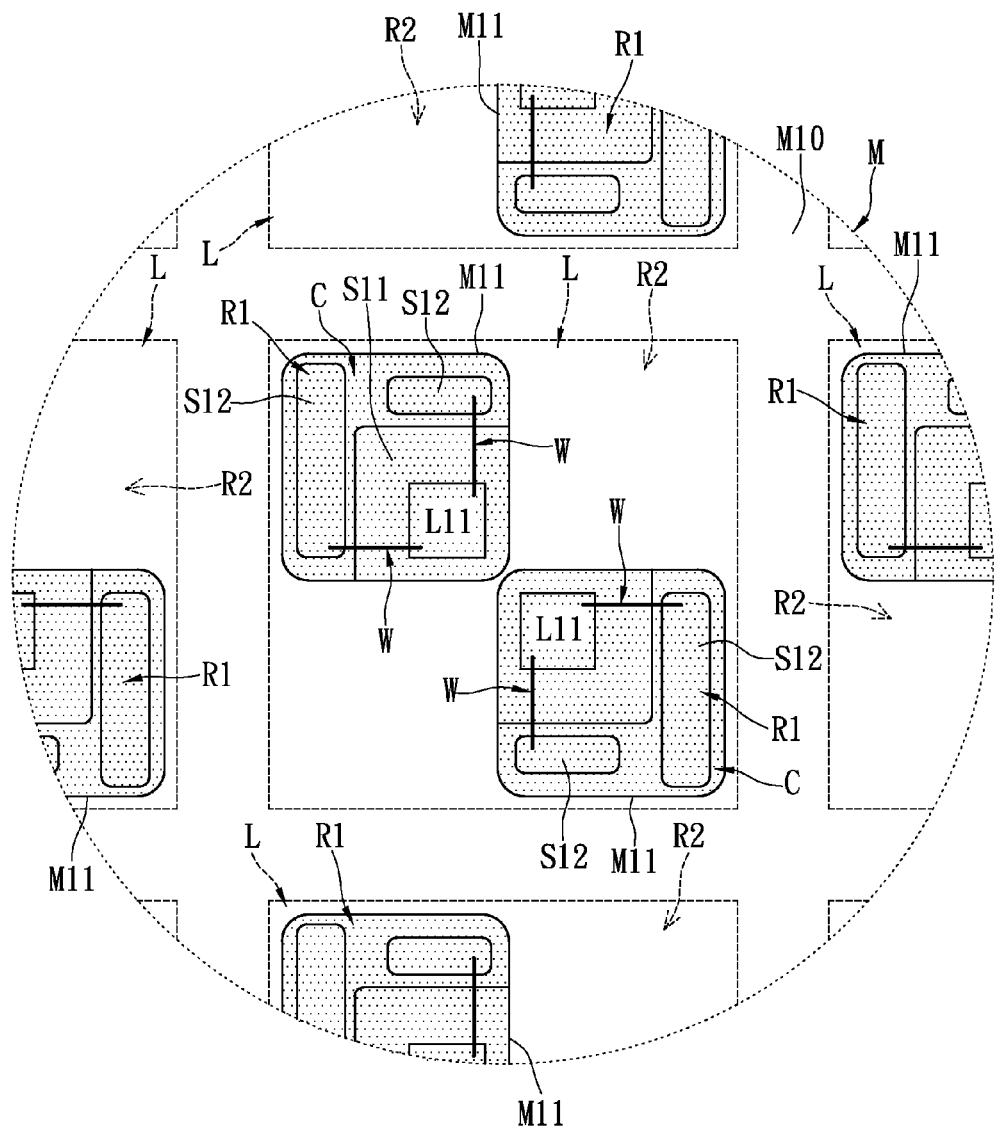

Please refer to FIGS. 1G, 1H, and 1I. After the carrier 1 is fixedly disposed on the second working platform 3, and the mask M is tightly attracted to the substrate S by the generated magnetic force (as shown in FIGS. 1G and 1H, where FIG. 1H is a partial enlarged view of the substrate S covered by the mask M), the luminescent solution C can be spray coated to the locations (as shown in FIG. 1I) where the substrate S is exposed through the slits M11. An exposed region of each light-emitting unit L through the slits M11 is defined as a first wire bonding region R1. Oppositely, a covered region of each light-emitting unit L through the covering body M10 is defined as a second wire bonding region R2.

As can be seen in FIGS. 1H and 1I, each light-emitting unit L includes two blue LED chips L11 disposed on a surface S11 of the substrate S and exposed by the slits M11. Each of the blue LED chips L11 is electrically connected to a pair of electrodes S12 of the substrate S through two wires W. Thus, when a luminescent solution C is spray coated to the first wire bonding regions R1 exposed by the slits M11, the blue LED chips L11 and the wires W are covered by the luminescent solution C. In addition, since the mask M is tightly attracted to the substrate S, small gaps or clearances between the covering body M10 and the substrate S are less likely to occur. Thus, the luminescent solution C is less likely to leak into the covered region of each light-emitted unit L. As a result, the yield rate of the second wire bonding process can be improved. In other words, the luminescent solution C is not easily leaked into the second wire bonding regions R2.

Then, after the spray coating process is completed, the control module 31 is switched to the off position. Thus, the magnetic force is no longer present on the second working platform 3. The carrier 1 is then removed from the second working platform 3 and fixedly disposed again on the first working platform 2. The press plate P is lifted away from the mask M (as shown in FIG. 1E), followed by protruding the catch mechanism 20 in an upward direction to elevate the mask M (as shown in FIG. 1D) for removal. After the catch mechanism 20 is retracted back into the first working platform 2, the luminescent solution-coated substrate S can be removed from the carrier 1 (as shown in FIG. 1A).

Figure 1J:
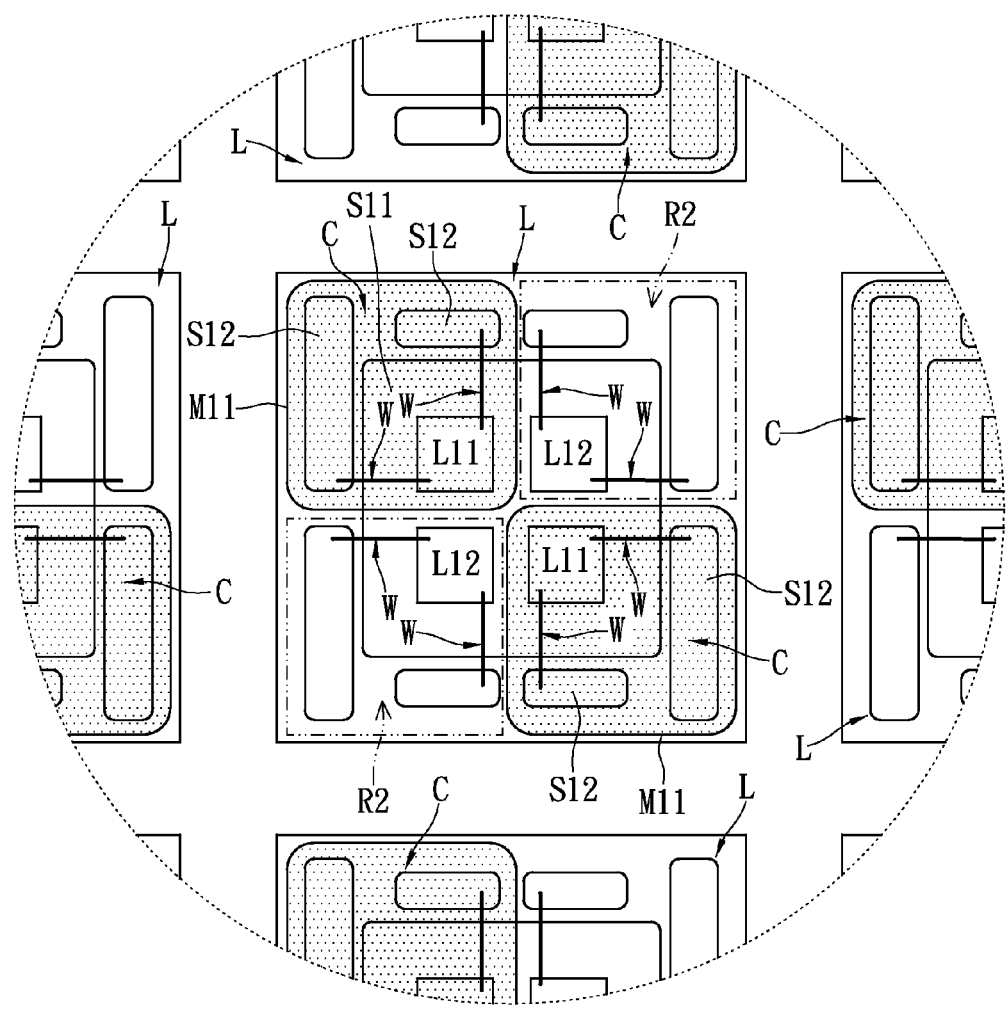

Next, please refer to FIG. 1J. A pair of red LED chips L12 are disposed on the surface S11 of the substrate S and connected electrically to the corresponding electrodes S12 through the wires W. Since the luminescent solution C is not easily leaked into the second wire bonding region R2 during the coating process, the yield rate of the wire bonding operation for the red LED chips L12 can be improved.

Based on the above, the positioning system for the first embodiment of the present invention is capable of aligning and fixing the substrate S (as shown in FIGS. 1A and 1B) that supports the light-emitting units L and the matching mask M (as shown in FIGS. 1C-1E). The positioning system comprises the above-mentioned devices. When the carrier 1 is disposed on the first working platform 2, the tip portions of each positioning member 20A and each support member 20B may be arranged at the protruded position (i.e., the first position), as shown in FIG. 1D, or at the retracted position (i.e., the second position), as shown in FIG. 1E.

At the first position, the main body 201A of each positioning member 20A is exposed protrudingly from the first working platform 2 and the carrier 1 and abuts to the undersurface of the covering body M10. The positioning head 202A of each positioning member 20A extends upward from the corresponding main body 201A and capable of being inserted through the corresponding first positioning hole M12. Whereas the support body 200B of each support member 20B is exposed protrudingly from the first working platform 2 and the carrier 1 and abuts the undersurface of the covering body M10.

At the second position, the tip portions of each positioning member 20A and each support member 20B disengage from the mask M. The fixing members 10 are inserted through the fixing holes S10 and the second positioning holes M13 sequentially. Thus, both the substrate S and the mask M are aligned and fixedly disposed by the positioning system.

In conjunction with FIGS. 1A and 1B, if the fixing members 10 and the fixing holes S10 are designed as a fool-proof profile as rectangular or polygonal, only one fixing member 10 and one fixing hole S10 are necessary to align and fixedly dispose the substrate S onto the carrier 1. Moreover, if the recess 12 is shaped in such a way, such as a fool-proof design, to work cooperatively with a single fixing member 10, the substrate S can be precisely disposed on the carrier 1 with further assurance. In conjunction with FIGS. 1C-1E, by using only one fixing member 10, the number of second positioning holes M13 may be one for the mask M. When the second positioning hole M13 is shaped in such a way, such as a fool-proof design, to work cooperatively with the fixing member 10, the mask M can be precisely disposed on the substrate S with further assurance.

In other words, the carrier 1 has at least one fixing member 10. The substrate S has at least one fixing hole S10 for receiving the fixing member 10. The mask M has at least one second retaining hole M13 corresponding to the fixing hole S10. Thus, when the fixing member 10 is inserted through the fixing hole S10 and the second positioning hole M13 in sequence, the substrate S is aligned and fixedly disposed on the carrier 1 and the mask M is aligned and fixedly disposed on the substrate S.

Second Embodiment

Please refer to FIGS. 2A-2E, which are respectively schematic views of operating the positioning system of a second embodiment of the present invention. Please note, the described procedures are for illustrative purpose only, along with the number of identified components in the discussion, and are not used to limit the scope of the present invention.

Figure 2A:
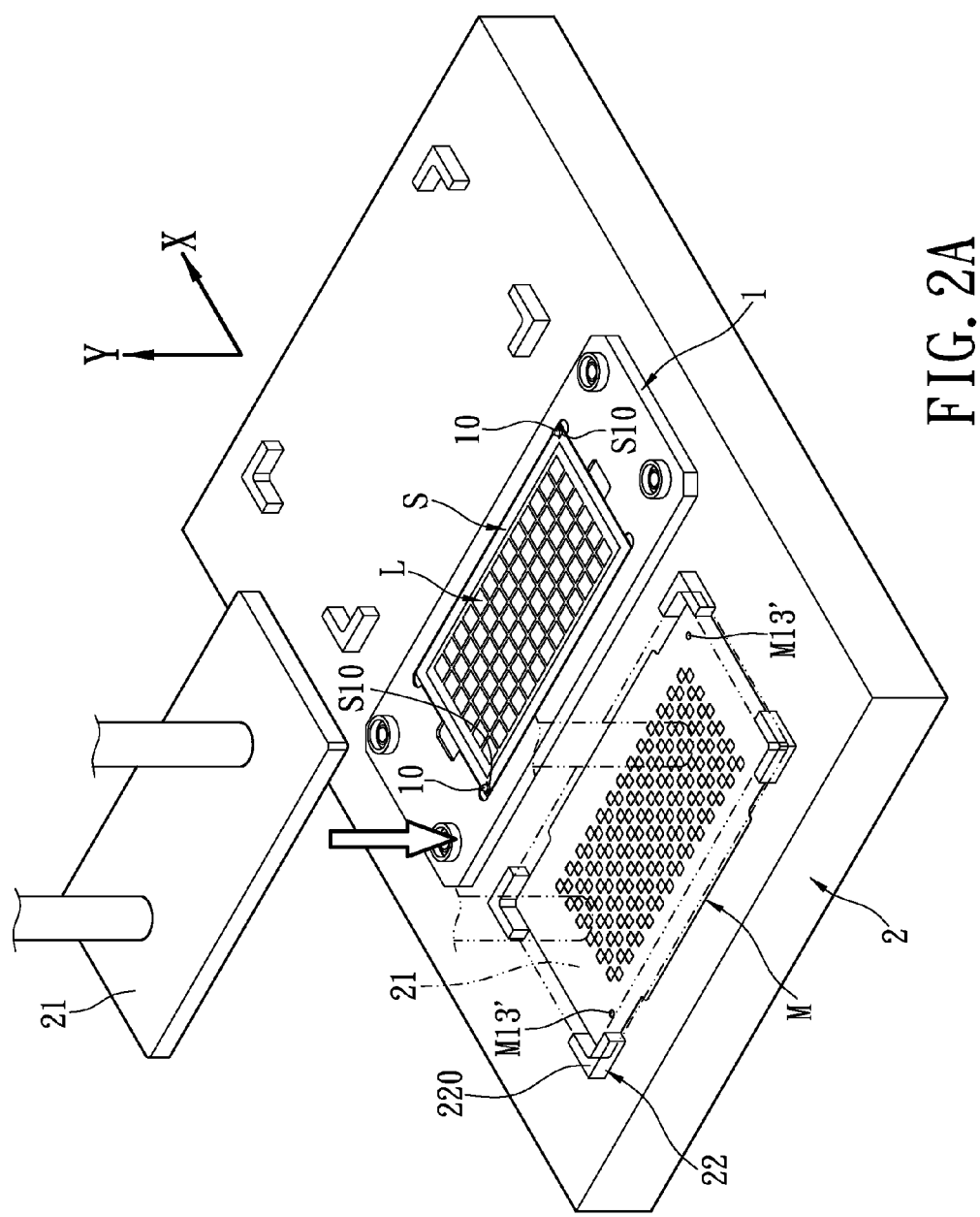
FIGS. 2A-2E show process flow diagrams process flow diagrams illustrating operating a positioning system for a second embodiment of the present invention.

As shown in FIG. 2A, a carrier 1 is disposed on an expanded first working platform 2 (the method of disposing the carrier 1 on the first working platform 2 is similar to that in the first embodiment). Then, the substrate S used for supporting the light-emitting units L is disposed on the carrier 1. The first working platform 2 further includes a suctioning device 21 and a first frame structure 22. The suctioning device 21 is used to suction the mask M that is retained inside the first frame structure 22. The mask M may be suctioned by vacuum or a magnetic force. The suctioning device 21 may be disposed on an XYZ table (not shown) to traverse in the X or Y direction arbitrarily. The XYZ table can be disposed on the first working platform 2 or be apart from the first working platform 2 and arranged at a predetermined location. The first frame structure 22 comprises four L-shaped first corner sidewalls 220.

Figure 2B:
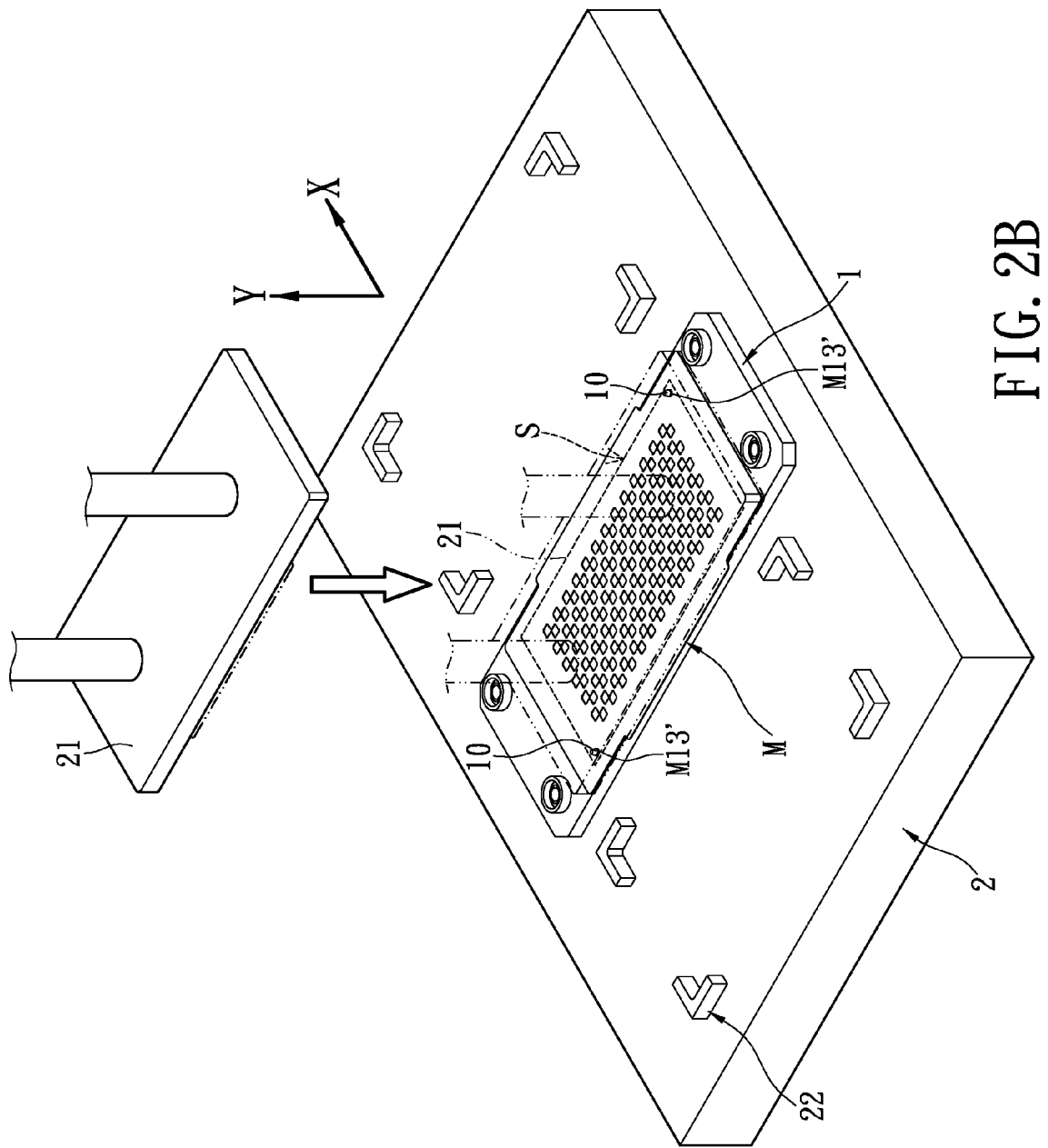

Please refer to FIGS. 2A and 2B. After the mask M pre-arranged in the first frame structure 22 is suctioned to the suctioning device 21, the suctioning device 21 transfers and releases the mask M onto the substrate S. Then, as shown in FIG. 2B, the mask M is secured onto the substrate S through the fixing members 10. The mask M has a pair of positioning holes M13' formed thereon (the location and function of the positioning holes M13' are the same as those of the second positioning holes M13 in the first embodiment). Since the positioning holes M13' are in alignment with fixing members 10, the positioning holes M13' are naturally penetrated by the fixing members 10 when the mask M is released by the suctioning device 21 and arranged on the substrate S. Thus, the mask M is arranged on the substrate S without touching the wire bonded LED chips of the light-emitting units L and wires (as shown in FIG. 1H).

Figure 2C:
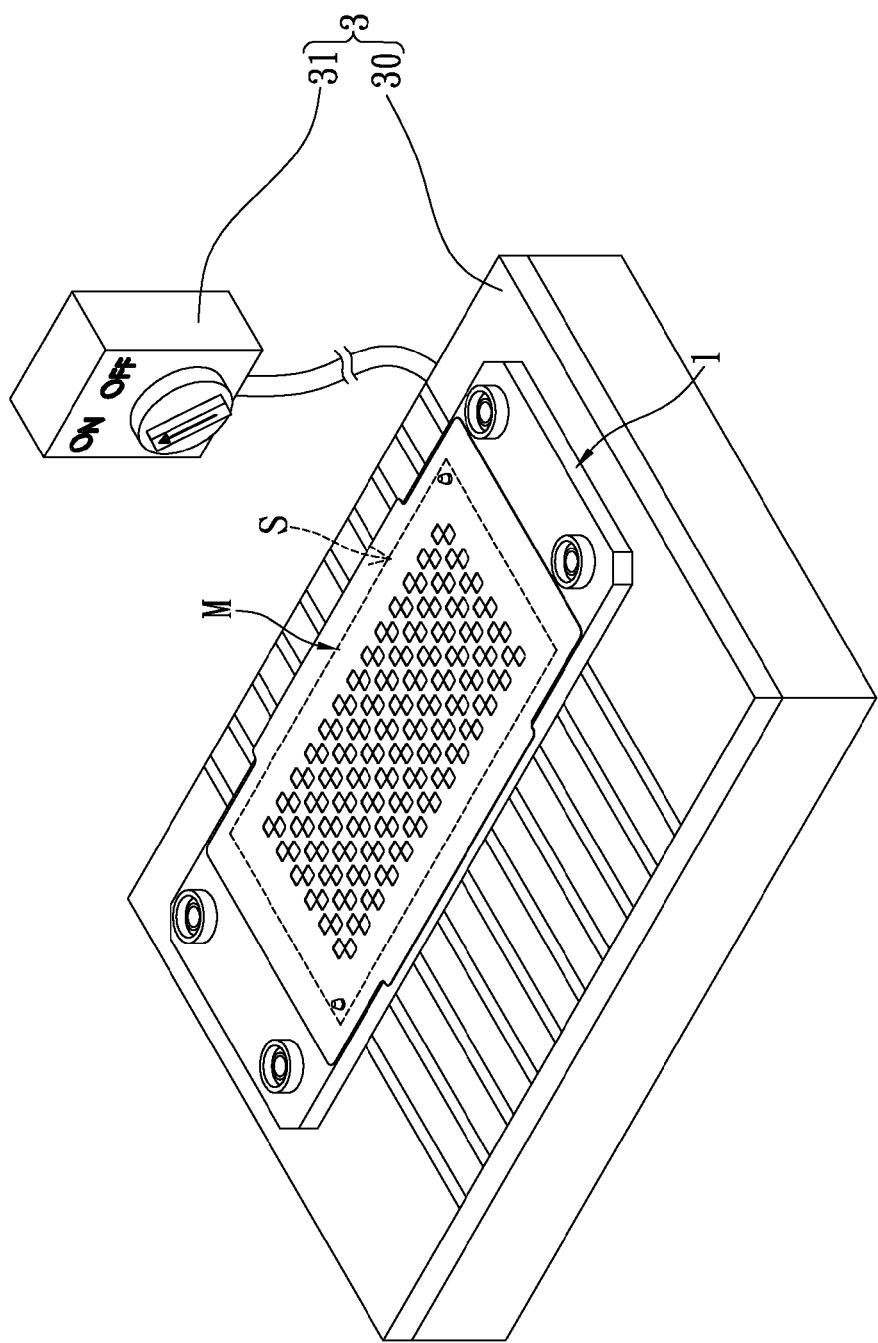

Please refer to FIGS. 2B and 2C. After the mask M has been disposed onto the substrate S (as shown in FIG. 2B), the carrier 1 having the mask M and the substrate S is removed from the first working platform 2. Then, the carrier 1 is disposed on the second working platform 3 (as shown in FIG. 2C), where the second working platform 3 is arranged at a predetermined distance away from the first working platform 2, i.e. the first and second working platforms 2 and 3 are spaced apart from each other. The substrate S is now ready to undergo the luminescent solution coating process. The second working platform 3 comprises an electromagnetic force generating module 30 and a control module 31 for switching the electromagnetic force generating module 30 on or off. Thus, once the carrier 1 is fixedly disposed on the second working platform 3, the presence of the magnetic force (i.e., the control module 31 is switched on) enables the mask M having magnetic attraction to be attracted tightly to the substrate S through the magnetic force generated by the electromagnetic force generating module 30. In other words, the mask M can be tightly attracted to the substrate S such that small gap or clearances are less likely to occur between the mask M and the substrate S. Thus, luminescent solution leakage can be prevented during the coating process. Hence, contamination of the second working platform 3 due to luminescent solution leakage through between the substrate S and the mask 3 can be avoided.

Figure 2D:
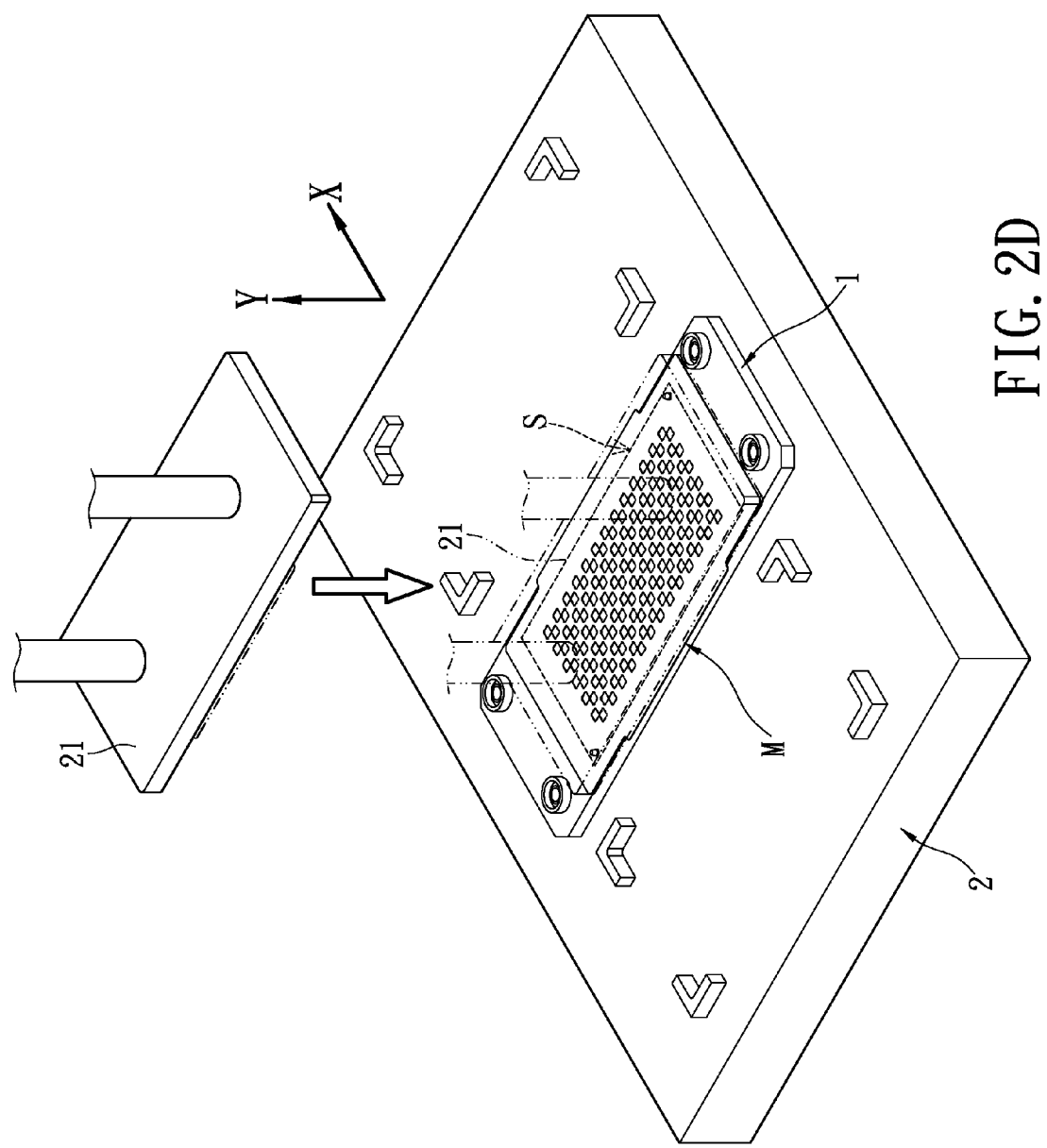

Please refer to FIGS. 2C and 2D. After the coating process is completed, the carrier 1 is removed from the second working platform 3 and re-disposed on the first working platform 2. The suctioning device 21 is used again to draw the mask M away from the substrate S.

Figure 2E:
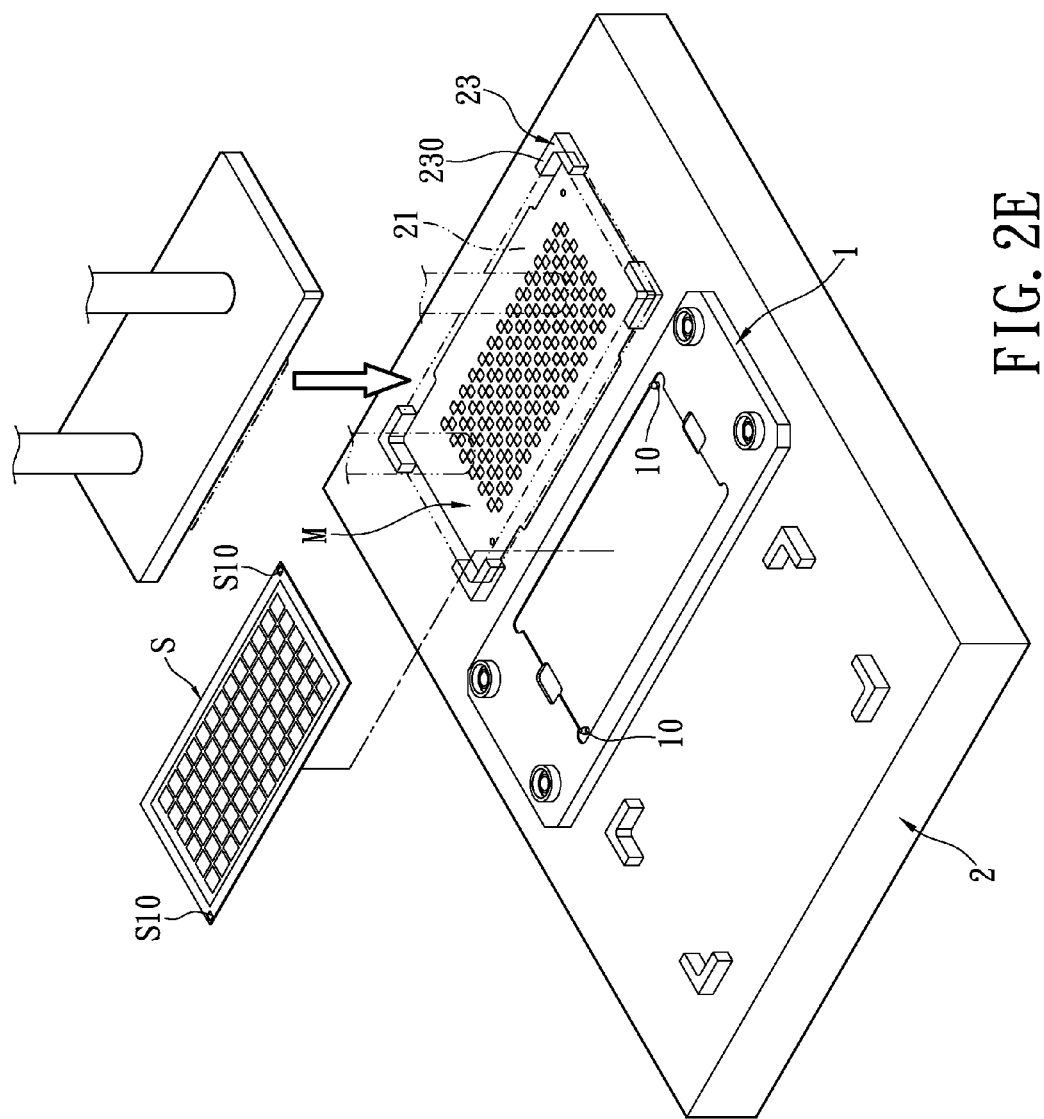

Please refer to FIGS. 2D and 2E. After the suctioning device 21 has drawn the mask M away from the substrate S, the mask M is transferred and disposed inside a second frame structure 23 of the first working platform 2. The second frame structure 23 includes a plurality of L-shaped second corner sidewalls 230. Typically, the number of second corner sidewalls 230 is four, and the second frame structure 23 is spaced apart from the first frame structure 22 on the first working platform 2. Then, the coated substrate S may be removed from the carrier 1.

Based on the above, the positioning system for the second embodiment of the present invention is used to align and fixedly dispose the substrate S (for supporting the light-emitting units L) and the matching mask M. The positioning system comprises the above-mentioned devices described as FIGS. 2A to 2E.

In conclusion, the positioning system of the present invention is capable of aligning and fixedly disposing the mask on the substrate through the fixing members. Thereby, the yield rates of the first and second wire bonding operations can be increased.

The description above only illustrates specific embodiments and examples of the present invention. The present invention should therefore cover various modifications and variations made to the herein-described structure and operations of the present invention, provided they fall within the scope of the present invention as defined in the following appended claims.

What is claimed is:

1. A positioning system, for aligning and disposing at least one substrate for supporting a plurality of light-emitting units and at least one mask corresponding to the substrate, comprising:
   a first working platform;
   a second working platform spaced apart from the first working platform wherein the second working platform includes an electromagnetic force generating module and a control module for switching the electromagnetic force generating module on or off; and
   a carrier fixed to one of the first working platform and the second working platform and having at least one fixing member for fixing the substrate onto the carrier and fixing the mask onto the substrate;
   wherein the substrate has at least one fixing hole formed thereon for receiving the fixing member, the mask has at least one positioning hole formed thereon in alignment with the fixing hole, and the fixing member is inserted through the fixing hole of the substrate and the positioning hole of the mask in sequence.

2. The positioning system of claim 1, wherein the mask has a covering body corresponding to the substrate and two positioning holes formed through the covering body.

3. The positioning system of claim 2, further comprising a press plate, wherein the press plate has a plate body pivotally disposed on the carrier for holding down a peripheral portion of the mask and an opening formed on the plate body for exposing a plurality of slits formed on the mask.

4. The positioning system of claim 1, wherein when the carrier is fixed to the second working platform, the mask is attracted to the substrate by the magnetic force generated from the electromagnetic force generating module.

5. The positioning system of claim 1, further comprising at least one suctioning device disposed on the first working platform.

6. A positioning system, for aligning and disposing at least one substrate for supporting a plurality of light-emitting units and at least one mask corresponding to the substrate, comprising:
   a first working platform, wherein the first working platform has at least one catch mechanism capable of being arranged at a protruded or retracted position, and the catch mechanism includes at least a pair of positioning members or at least a pair of support members;
   a second working platform spaced apart from the first working platform; and
   a carrier fixed to one of the first working platform and the second working platform and having at least one fixing member for fixing the substrate onto the carrier and fixing the mask onto the substrate;
   wherein the substrate has at least one fixing hole formed thereon for receiving the fixing member, the mask has at least one positioning hole formed thereon in alignment with the fixing hole, and the fixing member is inserted through the fixing hole of the substrate and the positioning hole of the mask in sequence.

7. The positioning system of claim 6, wherein the mask has a covering body corresponding to the substrate and two positioning holes formed through the covering body.

8. The positioning system of claim 7, further comprising a press plate, wherein the press plate has a plate body pivotally disposed on the carrier for holding down a peripheral portion of the mask and an opening formed on the plate body for exposing a plurality of slits formed on the mask.

9. The positioning system of claim 6, wherein when the carrier is fixed to the first working platform, respective tip portions of each positioning member and each support member are protruded from the first working platform to arrange above the substrate for aligning the mask or are retracted into the first working platform for fixing the mask onto the substrate through the fixing member.

10. The positioning system of claim 6, further comprising at least one suctioning device disposed on the first working platform.

* * * * *